(12) United States Patent
Kusukawa et al.

(10) Patent No.: US 9,137,888 B2
(45) Date of Patent: Sep. 15, 2015

(54) POWER DISTRIBUTION MOUNTING COMPONENT AND INVERTER APPARATUS USING SAME

(75) Inventors: Junpei Kusukawa, Hitachinaka (JP); Hironori Matsumoto, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 272 days.

(21) Appl. No.: 13/575,554

(22) PCT Filed: Jan. 24, 2011

(86) PCT No.: PCT/JP2011/051205
§ 371 (c)(1),
(2), (4) Date: Jul. 26, 2012

(87) PCT Pub. No.: WO2011/093239
PCT Pub. Date: Aug. 4, 2011

(65) Prior Publication Data
US 2012/0300417 A1 Nov. 29, 2012

(30) Foreign Application Priority Data
Jan. 27, 2010 (JP) ................... 2010-016036

(51) Int. Cl.
*H05K 1/00* (2006.01)
*H05K 1/09* (2006.01)
(Continued)

(52) U.S. Cl.
CPC ............ *H05K 1/0265* (2013.01); *H02G 5/005* (2013.01); *H02M 7/003* (2013.01)

(58) Field of Classification Search
CPC ................. H05K 1/0265; H05K 2201/10272; H02G 5/005; H02M 7/003
USPC ............. 174/257–259, 70 B, 99 B, 149 B; 361/601, 611, 624, 648, 301.1–306.3
See application file for complete search history.

(56) References Cited

U.S. PATENT DOCUMENTS 4,236,046 A   11/1980   De Vries
4,381,423 A   4/1983   Taylor
(Continued)

FOREIGN PATENT DOCUMENTS

JP    8-222028 A    8/1996
JP    11-113242 A   4/1999
(Continued)

OTHER PUBLICATIONS

International Search Report with English translation dated Mar. 22, 2011 (five (5) pages).
(Continued)

*Primary Examiner* — Hoa C Nguyen
(74) *Attorney, Agent, or Firm* — Crowell & Moring LLP

(57) ABSTRACT

The present invention is a power distribution mounting component operable at high voltages. More specifically, the power distribution mounting component includes: an insulating layer; current-carrying first conductor layers sandwiching the insulating layer; and a second conductor layer (thinner than the first conductor layers) interposed between the insulating layer and at least one of the first conductor layers. Each the second conductor layer between the insulating layer and the overlying current-carrying first conductor layer is sufficiently thinner than the first conductor layer and is therefore formed in close adhesion to the insulating layer, thereby increasing the partial discharge inception voltage of the power distribution mounting component and therefore its insulation reliability.

16 Claims, 6 Drawing Sheets

(51) Int. Cl.
*H05K 1/02* (2006.01)
*H02G 5/00* (2006.01)
*H02M 7/00* (2006.01)

(56) References Cited

U.S. PATENT DOCUMENTS

| | | | | |
|---|---|---|---|---|
| 4,401,843 A | * | 8/1983 | Harper et al. | 174/72 B |
| 4,403,108 A | * | 9/1983 | DeVries | 174/72 B |
| 4,440,972 A | * | 4/1984 | Taylor | 174/72 B |
| 4,570,031 A | * | 2/1986 | Inoue | 174/72 B |
| 2002/0195286 A1 | * | 12/2002 | Shirakawa et al. | 180/65.1 |

FOREIGN PATENT DOCUMENTS

| | | |
|---|---|---|
| JP | 2000-149667 A | 5/2000 |
| JP | 2000-215735 A | 8/2000 |
| JP | 2008-30392 A | 2/2008 |

OTHER PUBLICATIONS

European Search Report dated Mar. 13, 2014 (six (6) pages).

* cited by examiner

RESULTS OF PARTIAL DISCHARGE TEST FOR BUSBAR HAVING INSULATING LAYER WITHOUT ADHESIVE (AT ROOM TEMP.)

RESULTS OF PARTIAL DISCHARGE TEST FOR BUSBAR HAVING INSULATING LAYER WITH ADHESIVE (AT ROOM TEMP.)

RESULTS OF VOLTAGE STRESS LIFE TEST FOR BUSBAR HAVING
INSULATING LAYER WITHOUT ADHESIVE (AT 125°C)

RESULTS OF VOLTAGE STRESS LIFE TEST FOR BUSBAR HAVING
INSULATING LAYER WITH ADHESIVE (AT 125°C)

POWER DISTRIBUTION MOUNTING COMPONENT AND INVERTER APPARATUS USING SAME

TECHNICAL FIELD OF THE INVENTION

The present invention relates to power distribution mounting components operable at high voltages and inverters using such power distribution mounting components.

DESCRIPTION OF BACKGROUND ART

Inverters are now used in various electrical apparatuses such as hybrid electric vehicles (HEVs) and electric vehicles (EVs). The use of inverters in these applications has been increasing every year because of the recent environmental issues and energy saving promotion. And, today's inverters require high power, low power consumption and small size, and therefore technologies such as high voltage inverter circuits and high density mounting techniques are being developed.

Inverters mainly include: power modules having mounted therein power semiconductor devices (such as insulated gate bipolar transistors (IGBTs)); capacitors; coils; other components; and power distribution mounting components (often referred to as busbars) for carrying high currents inside the inverter. FIGS. 10 and 11 are schematic illustrations showing longitudinal sectional views of conventional power distribution mounting components used in inverters.

As illustrated in FIG. 10, in the conventional power distribution mounting component (hereinafter "busbar") 112, an insulating layer 102 (e.g. an insulator plate, paper or film) is interposed between thick conductors 100 of a metal (such as copper and aluminum), thereby providing insulation between the thick conductors 100. In FIG. 11, an adhesive layer 103 is formed on at least one surface of the insulating layer 102 and provides adhesion between the insulating layer 102 and the overlying thick conductor 100, and this insulating layer 102 with the at least one adhesive layer 103 provides insulation between the thick conductors 100. This is a more typical structure of conventional busbars (see, e.g., Patent Literature 1).

CITATION LIST

Patent Literature

Patent Literature 1: Japanese Patent Laid-open No. 2008-30392.

SUMMARY OF THE INVENTION

Problems to be Solved by the Invention

As described above, today's inverters require low energy consumption and high power, and because of this, voltages higher than several hundred volts are applied to inverter circuits. In order to provide inverters with high efficiency and/or suppressed surge voltage, today's busbars used in inverters require low inductance. Accordingly, thinner insulating layers interposed between thick conductors for busbars are now actively under development. For example, at present, a busbar for a 400-V class inverter uses an about 300-μm thick insulating layer between the thick conductors.

However, when a higher voltage (e.g., 500 V or higher) is applied across the thick conductors of conventional busbars (such as shown in FIG. 10 or 11) having such a thin insulating layer, there is arisen a problem in which the thin insulating layer is prone to be broken down dielectrically in a relatively short period of time. This impairs the long term reliability of inverters using such a busbar.

However, it is not preferable to thicken the insulating layer 102 and/or the adhesive layer 103 in order to ensure good high voltage insulation because it conflicts with the requirement for lower inductance. So, there is a strong demand for busbars having both low inductance and good high voltage insulation.

Accordingly, it is an objective of the present invention to provide a power distribution mounting component (busbar) having both good high voltage insulation and low inductance, thereby achieving inverters of high power, low energy consumption, high efficiency and small size. Another objective is to provide a high reliability inverter with a long service life using the invented busbar.

Solution to Problems (I) According to one aspect of the present invention, there is provided a power distribution mounting component operable at high voltages including:
an insulating layer;
current-carrying first conductor layers sandwiching the insulating layer; and
a second conductor layer interposed between the insulating layer and at least one of the first conductor layers, each the second conductor layer being thinner than the first conductor layers.

(II) According to another aspect of the present invention, there is provided a power distribution mounting component operable at high voltages including:
an adhesive-on-insulator multilayer including:
an insulating layer; and
an adhesive layer on at least one surface of the insulating layer;
current-carrying first conductor layers sandwiching the adhesive-on-insulator multilayer; and
a second conductor layer interposed between the adhesive-on-insulator multilayer and at least one of the first conductor layers, each the second conductor layer being thinner than the first conductor layers.

(III) According to still another aspect of the present invention, there is provided an inverter including:
at least one power module having a plurality of power semiconductor devices;
a control board including a drive circuit to drive switching operations of the power semiconductor devices; and
a power distribution mounting component connected to each the power module, the power distribution mounting component including:
an insulating layer;
current-carrying first conductor layers sandwiching the insulating layer; and
a second conductor layer interposed between the insulating layer and at least one of the first conductor layers, each the second conductor layer being thinner than the first conductor layers.

(IV) According to still another aspect of the present invention, there is provided an inverter including:
at least one power module having a plurality of power semiconductor devices;
a control board including a drive circuit to drive switching operations of the power semiconductor devices; and a power distribution mounting component connected to each the power module, the power distribution mounting component including:

an adhesive-on-insulator multilayer including:

an insulating layer; and an adhesive layer on at least one surface of the insulating layer;

current-carrying first conductor layers sandwiching the adhesive-on-insulator multilayer; and a second conductor layer interposed between the adhesive-on-insulator multilayer and at least one of the first conductor layers, each the second conductor layer being thinner than the first conductor layers.

In addition, in the above aspects (I) and (II) of the invented power distribution mounting components and in the above aspects (III) and (IV) of the invented inverters, the following modifications and changes can be made.

(i) A thickness of each the second conductor layer is 1 μm or more and less than 500

(ii) A thickness of each of the first conductor layers is from 0.5 to 10 mm.

In the invention, the thicknesses of the first and second conductor layers are along their respective lamination directions. And, in the invention's inverter, large currents between the power modules flow via the invented power distribution mounting component.

Advantages of the Invention

According to the present invention, it is possible to provide a power distribution mounting component having both good high voltage insulation and low inductance, thereby achieving inverters of high power, low energy consumption, high efficiency and small size. Also, by using the invented power distribution mounting component, there can be provided inverters having a long service life and high reliability along with high power, low energy consumption, high efficiency and small size.

Figure 1:
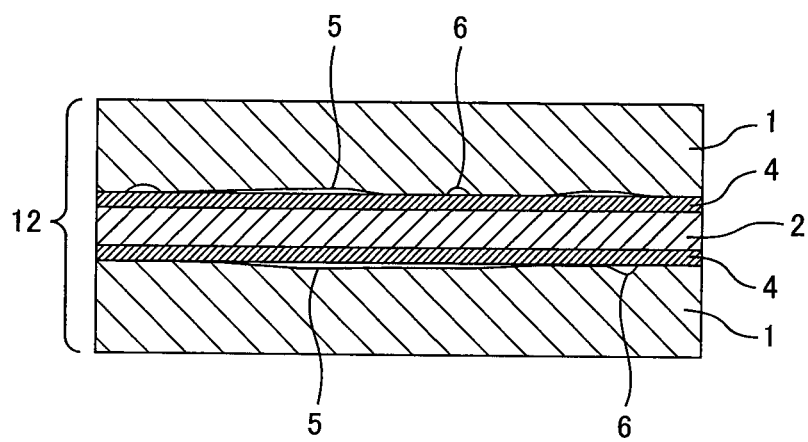
FIG. 1 is a schematic illustration showing a longitudinal sectional view of an example of a busbar according to a first embodiment of the present invention.

DETAILED DESCRIPTION OF THE PREFERRED EMBODIMENTS (Investigation of Cause of Dielectric Breakdown)

The inventors have intensively investigated the cause of dielectric breakdown under high voltage in conventional power distribution mounting components (shown in FIGS. 10 and 11) and have developed the present invention. The result of this investigation showed that insulating layer dielectric breakdown in the conventional power distribution mounting components is caused in the following manner:

Thick conductors for busbars are typically punched out from a plate of a good electrically conductive metal (e.g., copper) by means of a pressing machine or the like, and therefore unavoidably suffer from bending, deformation or surface microroughness such as scratch. When a thick conductor 100 and an insulating layer 102 are laminated together, such a surface microroughness 106 is prone to generate a space (gap) 105 at the lamination interface.

Particularly in the cases of the busbars 112 (FIG. 10) and 113 (FIG. 11) having a thin insulating layer 102, when a high voltage is applied across the two thick conductors 100, partial discharge occurs through a space (gap) 105 present between the insulating layer 102 and the overlying thick conductor 100 caused by a potential difference between these layers. Such partial discharge gradually deteriorates the insulating layer 102 and finally causes dielectric breakdown.

Figure 11:
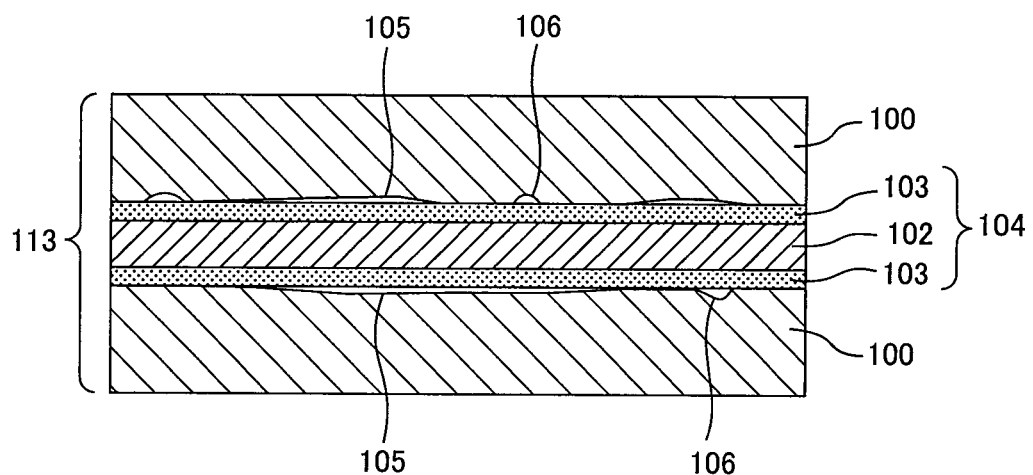
FIG. 11 is a schematic illustration showing a longitudinal sectional view of another example of a conventional power distribution mounting component used in an inverter.

In the FIG. 11 case where each thick conductor 100 is adhered to the insulating layer 102 by an adhesive layer 103, the formation of the space 105 can possibly be suppressed by increasing a thickness of the adhesive layer 103. However, as described above, increasing the thickness of the adhesive layer 103 is not preferable because it conflicts with the requirement for lower inductance.

Figure 12:
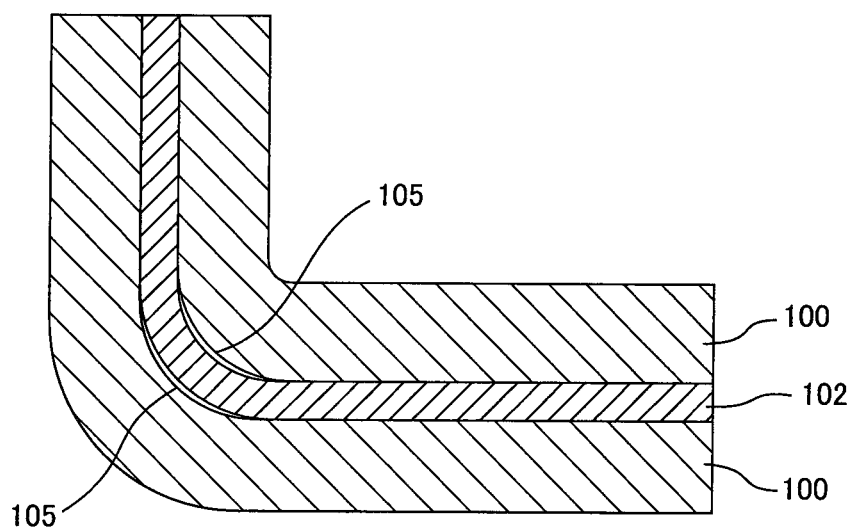
FIG. 12 is a schematic illustration of a longitudinal sectional view showing that a conventional power distribution mounting component is used in an L-bent state.

FIG. 12 is a schematic illustration of a longitudinal sectional view showing that a conventional power distribution mounting component is used in an L-bent state. As illustrated in FIG. 12, the spaces 105 present at the corner of the L-bent busbar 112 are expanded by the bending of the thick conductors 100, and as a result the insulating layer 102 is more likely to be degraded by the partial discharge.

As described above, in the conventional busbars, it is difficult to completely eliminate spaces present between the thick conductor and the insulating layer caused by microroughness unavoidably present on the surfaces of the thick conductor. The partial discharge is prone to occur more easily across such spaces driven by a potential difference between the thick conductor and insulating layer, and finally causes dielectric breakdown of the insulating layer.

Preferred embodiments of a power distribution mounting component (busbar) and a manufacturing method thereof according to the present invention and embodiments of an inverter using the invented busbar will be described below with reference to the accompanying drawings 1 to 9. These embodiments are described in the following order. Like members and parts are designated by like reference numerals without repeating the description thereof. However, the present invention is not limited to the specific embodiments described below.

1. First Embodiment: Busbar
2. Second Embodiment: Busbar
3. Comparison of Invented Busbar and Conventional Busbar
   3-1 Example 1
   3-2 Example 2
   3-3 Comparative Example 1
   3-4 Comparative Example 2
      3-5 Comparison Results
      3-5-2 Degradation Life Test under Voltage Stress
4. Third Embodiment: Inverter

1. First Embodiment

Busbar

FIG. 1 is a schematic illustration showing a longitudinal sectional view of an example of a busbar according to a first embodiment of the present invention. As illustrated in FIG. 1, a busbar 12 of the first embodiment includes a lamination including: an insulating layer 2; a pair of first conductor layers 1 sandwiching the insulating layer 2 and serving primarily to carry current; and second conductor layers 4 interposed between the insulating layer 2 and the respective first conductor layers 1.

The insulating layer 2 includes a film-shaped insulator paper or sheet. Example materials for the insulating layer 2 include: insulator papers made from celluloses obtained from wood etc., aramid papers made from aramid polymers; and insulator papers made from polyamides etc. Other examples include insulator sheets made from resins such as polyamide, polyimide, epoxy resin, phenol, polyethylene, polypropylene, polyester, polycarbonate, polyethylene terephthalate, polybutylene terephthalate, polystyrene, vinyl chloride, silicone, fluoropolymer, acrylic resin, polyether ether ketone, polyetherimide, ABS resin, polyphenylene sulfide. Besides the above-cited insulator papers and sheets, any other insulator may be used as the insulating layer 2 so long as it can provide electrical insulation between the pair of conductor layers.

The first conductor layers 1 are laminated in such a manner as to sandwich the film-like insulating layer 2. The first conductor layers 1 are made, for example, of a metallic material such as copper and aluminum. The first conductor layers 1 are the current carrying thick conductors of the busbar 12, and their thicknesses (along the lamination direction, i.e. the vertical direction of FIG. 1) are preferably from 0.5 to 10 mm. The thick first conductor layers 1 are preferably 0.5 mm or more in thickness because they need to carry large currents. A first conductor layer 1 less than 0.5 mm in thickness cannot carry sufficiently high currents. However, a first conductor layer 1 with a thickness more than 10 mm will disadvantageously increase a size of the busbar 12 and therefore a size of inverters using the busbar 12. Even when the thickness of the first conductor layer 1 is 10 mm or less, the first conductor layer 1 can carry sufficient currents required for inverters. For these reasons, the thickness of the first conductor layer 1 is preferably 10 mm or less.

The second conductor layer 4 is disposed directly on a surface of the insulating layer 2 and between the insulating layer 2 and the first conductor layer 1. In the first embodiment, the second conductor layer 4 is provided on both surfaces of the insulating layer 2. The second conductor layer 4 is made, like the first conductor layer 1, of a metallic material such as copper and aluminum. The second conductor layers 4 are conductor films for suppressing the adverse effect of the spaces (gaps) 5 present between the insulating layer 2 and the first conductor layers 1 (which are the current carrying thick conductors of the busbar 12). The second conductor layers 4 are formed to be thinner than the first conductor layers 1.

Such a sufficiently thin second conductor layer 4 can be laminated to adhere closely to the insulating layer 2 with no or little gaps therebetween. As a result, no partial discharges are caused by a potential difference between each second conductor layer 4 and the insulating layer 2.

Because the first and second conductor layers 1 and 4 are both made of a metallic material, there is no potential difference between the first and second conductor layers 1 and 4. As a result, even when a roughness 6 on the surface of the first conductor layer 1 produces a gap 5 between the first conductor layer 1 and the underlying second conductor layer 4, no partial discharges occur through the gap 5. Thus, the deterioration of the insulating layer 2 can be prevented.

The thickness (along the lamination direction, i.e. the vertical direction of FIG. 1) of the second conductor layer 4 is preferably 1 µm or more and less than 500 µm. When a second conductor layer 4 with a thickness less than 1 µm is formed on the insulating layer 2, the resulting second conductor layer 4 may consist of a plurality of islands of the material of the second conductor layer 4 and the insulating layer 2 may have some surface areas on which no second conductor layer 4 is formed. Or, the resulting second conductor layer 4 may be easily peeled off if a scratch occurs on its surface. Such a second conductor layer 4 having holes generates the gaps 5 between the insulating layer 2 and the overlying first conductor layer 1. As a result, the partial discharge occurs through the gaps 5. Thus, the thickness of the second conductor layer 4 is preferably 1 µm or more.

On the other hand, when the second conductor layer 4 is 500 µm or thicker, spaces are prone to be formed at the interface with the insulating layer 2 for the same reason as described above for the conventional thick-conductor/insulating-layer interface. As a result, the partial discharge tends to easily occur through such spaces. In other words, it is difficult to form a second conductor layer 4 with a thickness of 500 µm or more on the insulating layer 2 in such a manner as to adhere closely to the insulating layer 2 with no or less spaces therebetween, and therefore the above-described intended advantageous effect cannot be obtained. Thus, the thickness of the second conductor layer 4 is preferably thinner than 500 µm.

As described above, in the busbar 12 according to the first embodiment, the insulating layer 2 and each second conductor layer 4 are laminated to adhere closely to each other with no or less gaps. As a result, occurrence of the partial discharge between the insulating layer 2 and the first conductor layer 1 overlying the second conductor layer 4 can be prevented and thereby the degradation of the insulating layer 2 can be prevented. In addition, the current-carrying first conductor layers 1 can be formed to a thickness comparable to those of conventional thick conductors, and therefore can carry sufficiently high currents.

Figure 2:
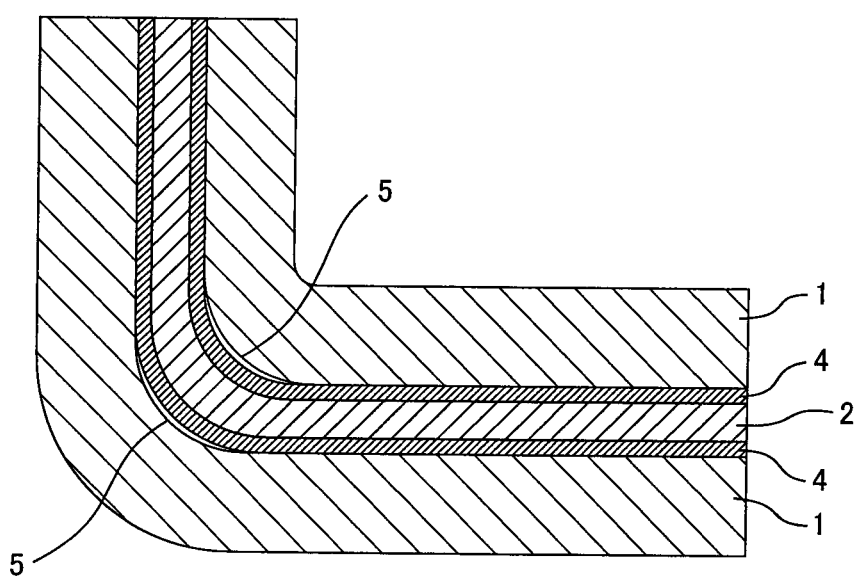
FIG. 2 is a schematic illustration of a longitudinal sectional view showing that a busbar of the first embodiment of the invention is used in an L-bent state.

FIG. 2 is a schematic illustration of a longitudinal sectional view showing that the busbar of the first embodiment is used in an L-bent state. As illustrated in FIG. 2, even when the busbar 12 is bent, the close adhesion between each second conductor layer 4 and the insulating layer 2 is maintained without generating any spaces therebetween. In addition, even when a gap 5 is produced between the first conductor layer 1 and the underlying second conductor layer 4 at a corner of the L-bent busbar 12, no partial discharges occur through the gap 5 because the first and second conductor layers 1 and 4 have the same potential, and therefore the insulating layer 2 is not degraded. Thus, even when the busbar 12 of the first embodiment is used in such an L-bent state as may potentially generate gaps 5 between the thick first conductor layers 1 and the insulating layer 2, the deterioration of the insulating layer 2 can be prevented.

The busbar 12 of the first embodiment can be manufactured by first forming a thin second conductor layer 4 on the opposite surfaces of an insulating layer 2 in a close adhesive fashion, and then by forming a first conductor layer 1 on each second conductor layer 4. Examples of methods of forming a second conductor layer 4 that adheres closely to an insulating layer 2 are as follows: A second conductor layer 4 of a copper thin film may be adhered (e.g., thermocompression bonded) to an insulating layer 2 of an insulator sheet or paper. Or, an electrically conductive varnish having a conductive material (such as metal powders and carbon black) dispersed in an organic resin may be applied on an insulating layer 2. Or, a thin conductive film may be formed on an insulating layer 2 by a technique such as vapor deposition and sputtering.

An objective of the first embodiment is to prevent the formation of spaces directly present between the insulating layer 2 and the current-carrying conductor layers 1 by forming the second conductor layers 4 that adhere closely to the insulating layer 2. Therefore, the method for forming the second conductor layer 4 is not limited to the above examples so long as it can form a second conductor layer 4 that adheres closely to the insulating layer 2.

In the above-described busbar 12 of the first embodiment, the second conductor layer 4 is formed on both surfaces of the insulating layer 2 and the first conductor layer 1 is formed on each second conductor layer 4. However, the invention is not limited to such a structure. For example, the second conductor layer 4 may be formed on at least one surface of the insulating layer 2. Even this structure can also effectively reduce the deterioration of the insulating layer 2, comparing with the conventional ones.

2. Second Embodiment

Busbar

Figure 3:
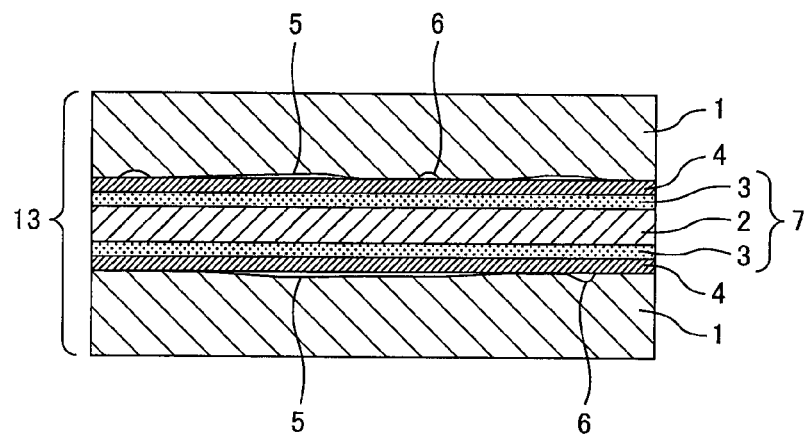
FIG. 3 is a schematic illustration showing a longitudinal sectional view of an example of a busbar according to a second embodiment of the present invention.

FIG. 3 is a schematic illustration showing a longitudinal sectional view of an example of a busbar according to a second embodiment of the present invention. As illustrated in FIG. 3, the busbar 13 of the second embodiment includes: an adhesive-on-insulator multilayer 7 including an insulating layer 2 and adhesive layers 3 on opposite surfaces of the insulating layer 2; a pair of first conductor layers 1 sandwiching the adhesive-on-insulator multilayer 7; and second conductor layers 4 interposed between the multilayer 7 and the respective first conductor layers 1.

Each first conductor layer 1 is laminated in a direction normal to the planes of the adhesive layers 3. The lamination relationship among the first conductor layers 1, the second conductor layers 4 and the insulating layer 2 is the same as in the first embodiment. The adhesive layers 3 are provided in order to adhere the second conductor layers 4 (to be interposed between the first conductor layers 1 and the insulating layer 2) to the insulating layer 2.

Examples of a material for the adhesive layers 3 are epoxy resin based adhesives, phenol resin based adhesives, silicone resin based adhesives, acrylic resin based adhesives, polyimide resin based adhesives and urethane resin based adhesives. As described, the adhesive layers 3 are provided in order to adhere the double-conductor layers (more specifically, the second conductor layers 4) to the insulating layer 2 of an insulator paper or sheet. Therefore, the material for the adhesive layers 3 is not limited to the above examples so long as it has sufficient adhesiveness to the insulating layer 3 and the second conductor layers 4.

The busbar 13 of the second embodiment can be manufactured by first forming adhesive layers 3 on opposite surfaces of an insulating layer 2 to form an adhesive-on-insulator multilayer 7, then by forming second conductor layers 4 on opposite surfaces of the adhesive-on-insulator multilayer 7, and finally by forming first conductor layers 1 in such a manner as to sandwich the adhesive-on-insulator multilayer 7 having the second conductor layers 4 on its both surfaces.

The second embodiment also offers the same advantageous effects as the first embodiment. In the second embodiment too, by using a thin conductor film as each second conductor layer 4, the second conductor layer 4 can be formed to adhere closely to the underlying adhesive layer 3. Therefore, unlike conventional busbars, the adhesive layer of the second embodiment dose not need to be formed thick enough to fill spaces which would otherwise be formed between the insulating layer and the overlying conductor layer, thereby enabling a reduction in inductance.

In the FIG. 3 busbar 13 of the second embodiment, the adhesive layer 3 is formed on both surfaces of the insulating layer 2. However, the invention is not limited to such a structure, but the adhesive layer 3 may be formed on only one surface of the insulating layer 2. In addition, in the second embodiment, the second conductor layer 4 is formed on both surfaces of the adhesive-on-insulator multilayer 7. However, the second conductor layer 4 may be formed on at least one surface of the adhesive-on-insulator multilayer 7. This structure can also reduce the degradation of the insulating layer 2 more effectively than the structures of conventional busbars.

Figure 4:
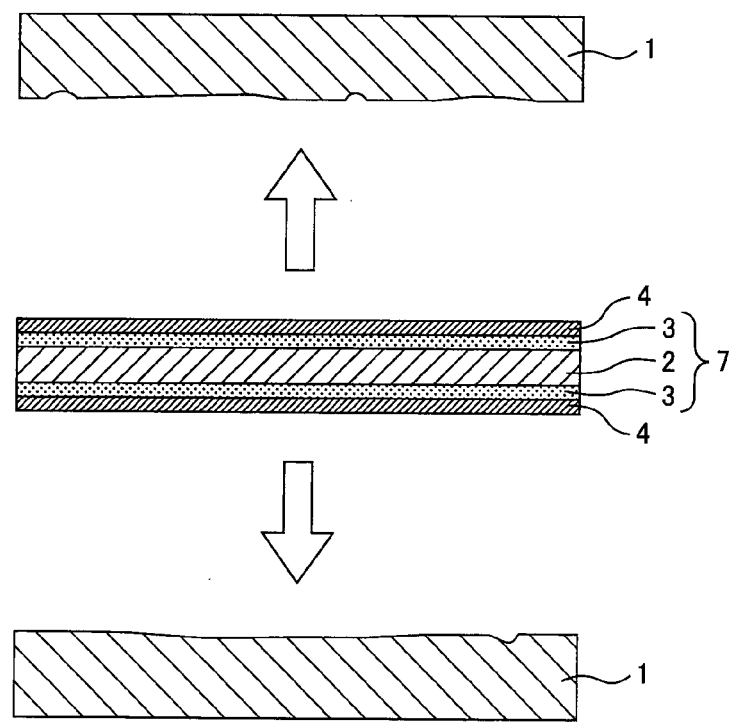
FIG. 4 is a schematic illustration of a longitudinal sectional view showing how a busbar according to the second embodiment can be recycled.

Moreover, the first conductor layers 1 of the busbar 13 of the second embodiment can be easily recycled. FIG. 4 is a schematic illustration of a longitudinal sectional view showing how a busbar according to the second embodiment can be recycled. As illustrated in FIG. 4, in the busbar 13, no adhesive or the like is used between each first conductor layer 1 and the underlying second conductor layer 4, and therefore the first conductor layer 1 can be easily removed from the underlying second conductor layer 4, thereby enabling the recycling of the first conductor layer 1. Thus, the busbar 13 of the second embodiment has good recyclability. In addition, the structure of the busbar 12 of the first embodiment also has the effect of enhancing recyclability similar to the second embodiment.

As has been described, in the busbar (power distribution mounting component) of the present invention, the second conductor layer 4 formed on at least one surface of the insulating layer 2 (or adhesive-on-insulator multilayer 7) is sufficiently thinner than the overlying first conductor layer 1, and can therefore be formed to adhere closely to the insulating layer 2 (or adhesive-on-insulator multilayer 7). As a result, no gap 5 is generated between the insulating layer 2 (or adhesive-on-insulator multilayer 7) and the second conductor layer 4, and therefore, no partial discharges occur, thereby preventing the degradation of the insulating layer 2 (or 7).

3. Comparison of Invented Busbar and Conventional Busbar

Next, tests for comparing the busbars of the first and second embodiments of the invention (Examples) and conventional busbars (Comparative examples) are described with reference to FIGS. 5 to 8.

3-1 Preparation of Example 1

Example 1 busbar is an example of the busbar 12 of the first embodiment. The Example 1 busbar was fabricated as follows: A polyimide sheet (thickness of 0.25 mm) was used as the insulating layer 2; a copper film (thickness of 35 μm) was used as the second conductor layer 4; and a thick copper conductor (thickness of 2 mm) was used as the first conductor layer 1.

First, the copper film (second conductor layer 4) was thermal fusion bonded to the both surfaces of the polyimide sheet (insulating layer 2). Then, the thick copper conductor (first conductor layer 1) was formed on the surface of each second conductor layer 4.

3-2 Preparation of Example 2

Example 2 busbar is an example of the busbar 13 of the second embodiment. The Example 2 busbar was fabricated as follows: An aramid insulating paper (thickness of 0.25 mm) was used as the insulating layer 2, an epoxy resin based adhesive as the adhesive layer 3, a copper film (thickness of 35 μm) as the second conductor layer 4, and a thick aluminum conductor (thickness of 3 mm) as the first conductor layer 1.

First, the epoxy resin based adhesive (about 30 μm thick) was applied on the both surfaces of the aramid insulating paper (insulating layer 2) to form the adhesive-on-insulator multilayer 7. Next, the copper film (second conductor layer 4) was vacuum pressed to the surface of each applied adhesive. Then, the first conductor layer 1 was formed on the surface of each second conductor layer 4.

3-3 Preparation of Comparative Example 1

Figure 10:
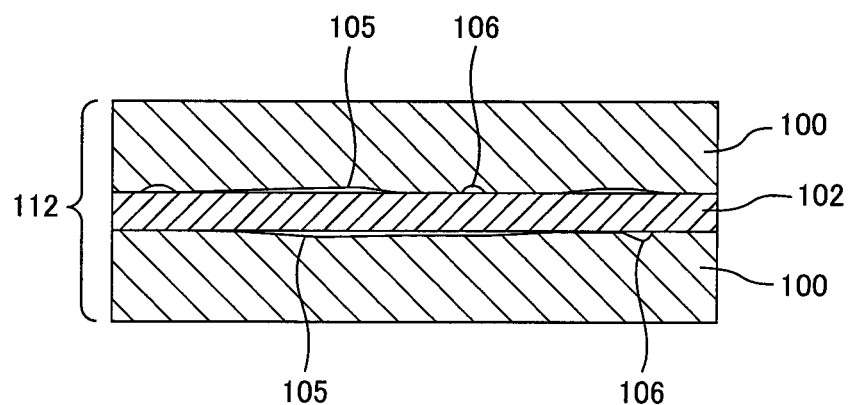
FIG. 10 is a schematic illustration showing a longitudinal sectional view of an example of a conventional power distribution mounting component used in an inverter.

Comparative example 1 busbar is an example of the busbar 112 of FIG. 10. The Comparative Example 1 busbar was fabricated as follows: A thick copper conductor (thickness of 2 mm) was used as the thick conductor 100, and a polyimide sheet (thickness of 0.25 mm) as the insulating layer 102. The thick conductors 100 were directly formed on the both surfaces of the insulating layer 102.

3-4 Preparation of Comparative Example 2

Comparative example 2 busbar is an example of the busbar 113 of FIG. 11. The Comparative example 2 busbar was fabricated as follows: A thick aluminum conductor (thickness of 3 mm) was used as the thick conductor 100, an aramid insulating paper (thickness of 0.25 mm) as the insulating layer 102, and an epoxy resin based adhesive as the adhesive layer 103.

First, the epoxy resin based adhesive (about 30 μm thick) was applied on the both surfaces of the aramid insulating paper (insulating layer 102) to form the adhesive-on-insulator multilayer 104. Next, the thick conductors 100 were vacuum pressed to the both surfaces of the adhesive-on-insulator multilayer 104.

3-5 Comparison Results

In order to examine the effects of the invention, a partial discharge test and a degradation life test under voltage stress were performed as follows for Examples 1 and 2 and Comparative examples 1 and 2.

[3-5-1 Partial Discharge Test]

Each test sample busbar of Examples 1 and 2 and Comparative examples 1 and 2 was placed in a shield room in order to prevent the interference of environmental noises with the partial discharge test, and was measured for the partial discharge initiation voltage. The partial discharge initiation voltage was measured by means of a partial discharge automatic test system as follows: An AC voltage was applied across the pair of the thick conductor layers of the test sample busbar, and the voltage was increased from 0 V at a rate of 100 V/s. The partial discharge inception voltage was defined as the threshold voltage at which a discharge of 2 pC began to occur.

Figure 5:
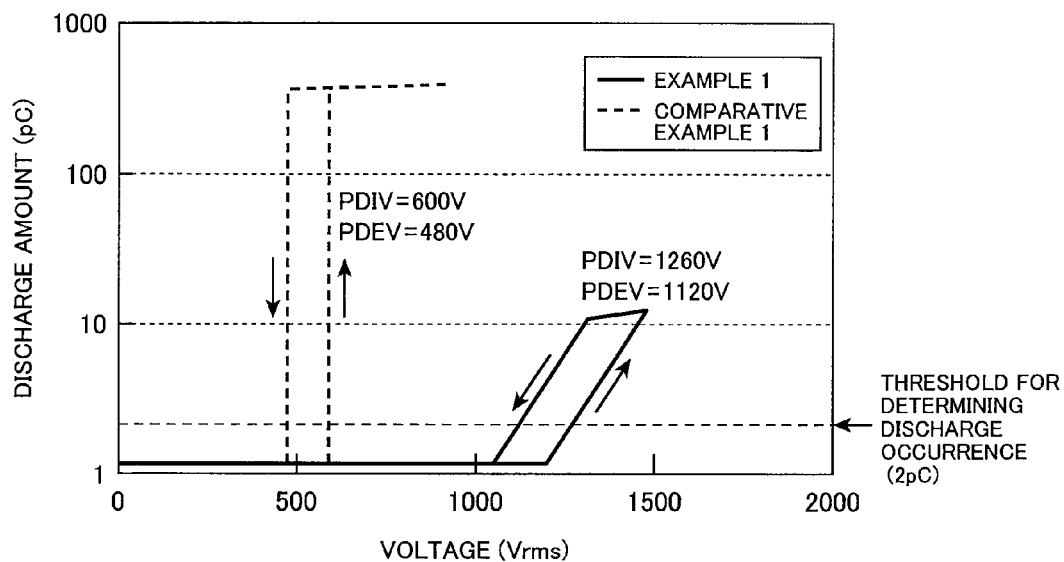
FIG. 5 is a chart showing results of a partial discharge test for Example 1 and Comparative example 1.
Figure 6:
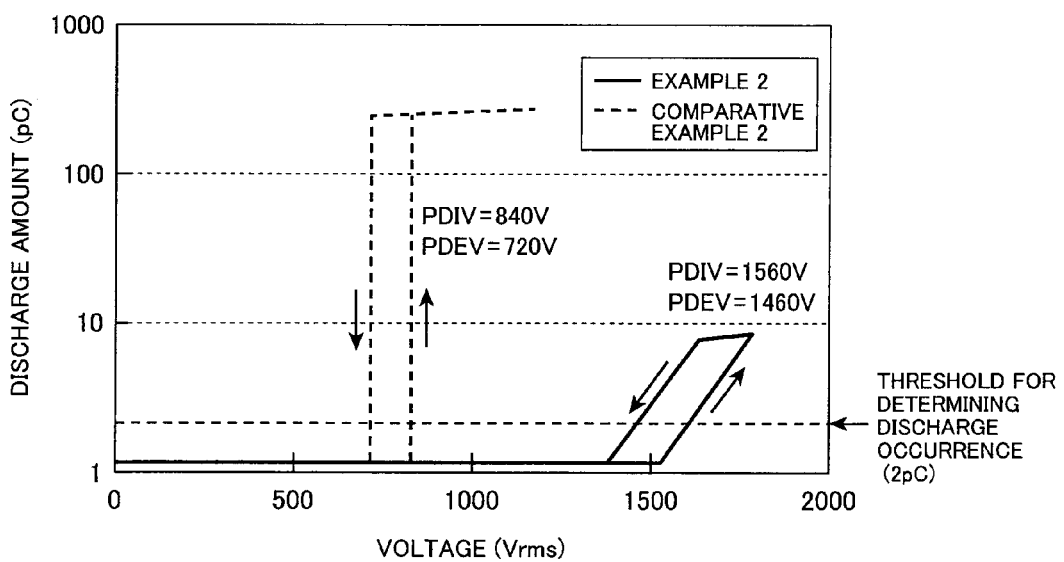
FIG. 6 is a chart showing results of a partial discharge test for Example 2 and Comparative example 2.

FIG. 5 is a chart showing results of a partial discharge test for Example 1 and Comparative example 1. FIG. 6 is a chart showing results of a partial discharge test for Example 2 and Comparative example 2. In FIGS. 5 and 6, the abscissa represents voltage (Vrms) and the ordinate represents amount of discharge (pC).

As shown in FIG. 5, for the Example 1 busbar using an insulating layer without any adhesive layer, the partial discharge initiation voltage (hereinafter, PDIV) was 1260 V and the partial discharge extinction voltage (hereinafter, PDEV) was 1120 V. For the Comparative example 1 busbar using an insulating layer without any adhesive layer, the PDIV and PDEV were 600 V and 480 V, respectively. Thus, Example 1 has a higher partial discharge initiation voltage and a higher partial discharge extinction voltage than Comparative example 1.

As shown in FIG. 6, for the Example 2 busbar using an insulating layer with an adhesive layer, the PDIV and PDEV were 1560 V and 1460 V, respectively. For the Comparative example 2 busbar using an insulating layer with an adhesive layer, the PDIV and PDEV were 840 V and 720 V, respectively. Thus, Example 2 has a higher partial discharge initiation voltage and a higher partial discharge extinction voltage than Comparative example 2.

[3-5-2 Degradation Life Test Under Voltage Stress]

Each test sample busbar of Examples 1 and 2 and Comparative examples 1 and 2 was placed in a thermostat (125° C.) and a 50-Hz mains voltage was applied across the pair of the thick conductor layers (first conductor layers for Examples 1 and 2) of the test sample busbar. Under this condition, the duration to the dielectric breakdown of the insulating layer was measured.

Figure 7:
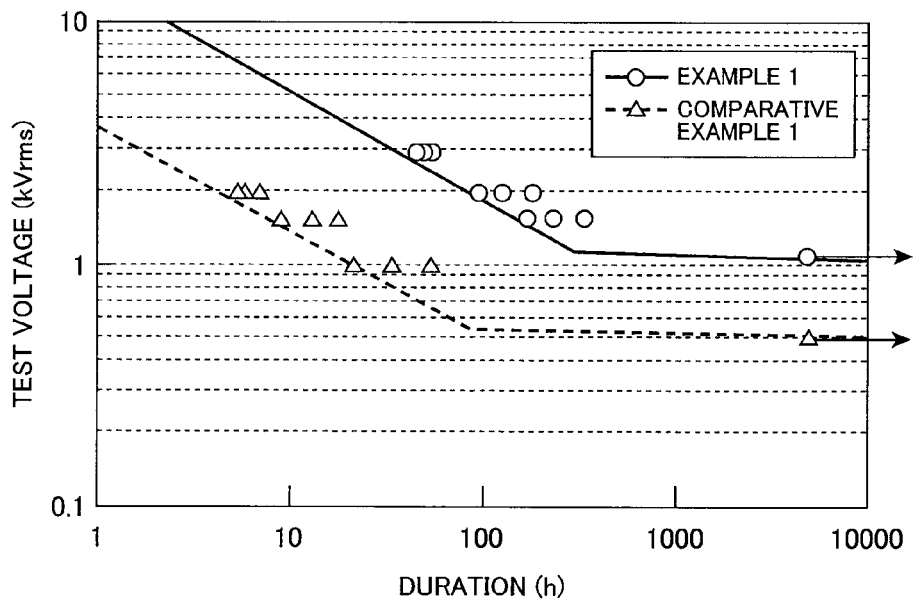
FIG. 7 is a graph showing results of a degradation life test under voltage stress for Example 1 and Comparative example 1.
Figure 8:
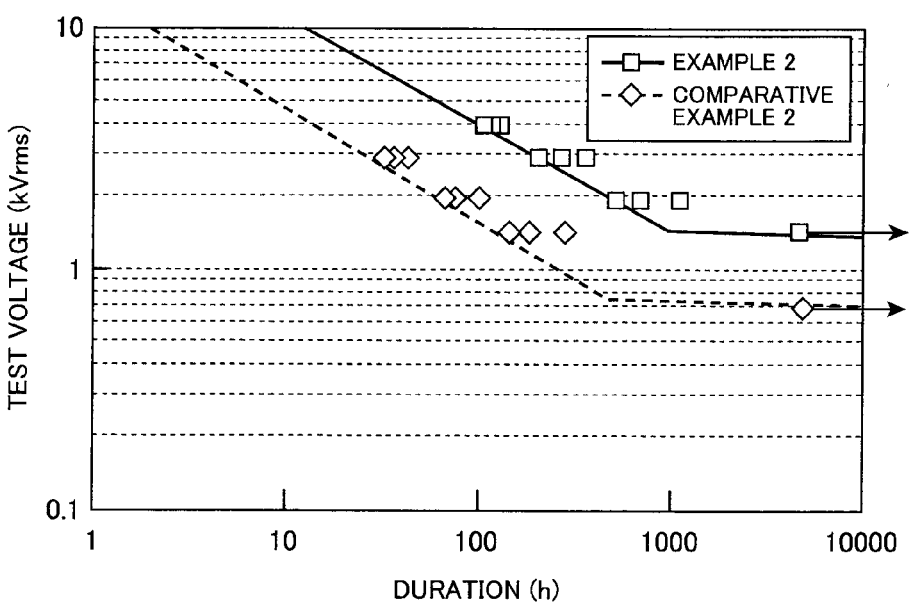
FIG. 8 is a graph showing results of a degradation life test under voltage stress for Example 2 and Comparative example 2.

FIG. 7 is a graph showing results of a degradation life test under voltage stress for Example 1 and Comparative example 1. FIG. 8 is a graph showing results of a degradation life test under voltage stress for Example 2 and Comparative example 2. In FIGS. 7 and 8, the abscissa represents test voltage (kV) and the ordinate represents duration (h).

As shown in FIG. 7, the degradation life time (duration to dielectric breakdown) under voltage stress of the Example 1 busbar was about 10 times longer than that of the Comparative example 1 busbar. As shown in FIG. 8, the life time of the Example 2 busbar was about 8 times longer than that of the Comparative example 2 busbar. Thus, Example 1 has a longer degradation life time (i.e., higher insulation reliability) than Comparative example 1, and Example 2 has a longer degradation life time (i.e., higher insulation reliability) than Comparative example 2.

All the test results above demonstrate that the busbar of the invention is a high voltage component having a lower susceptibility to partial discharge, a higher partial discharge initiation voltage and therefore higher insulation reliability than conventional busbars.

4. Third Embodiment

Inverter

Figure 9:
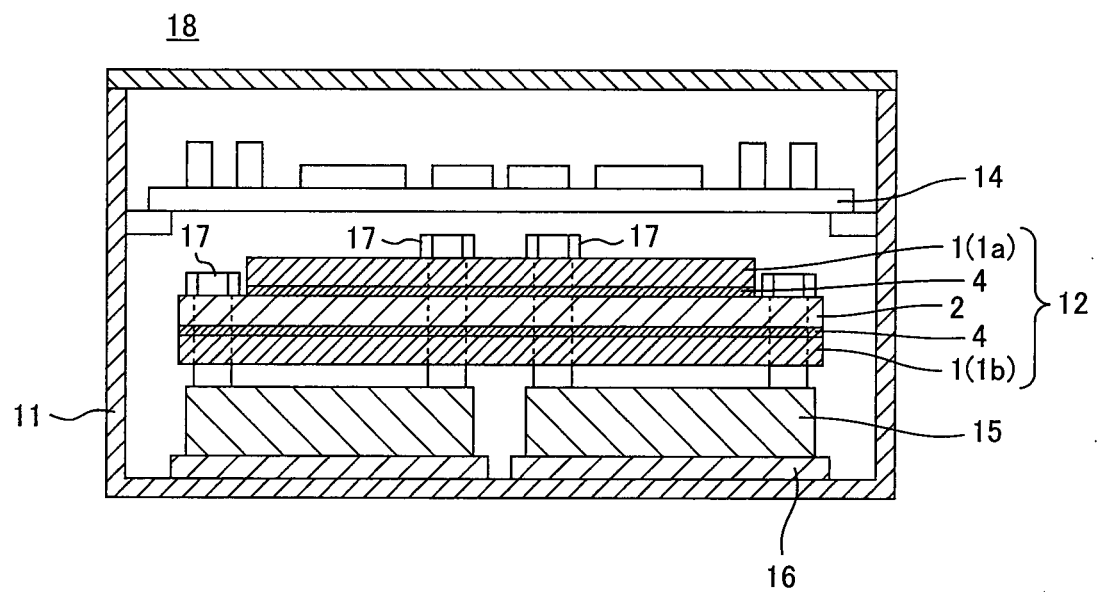
FIG. 9 is a schematic illustration showing a longitudinal sectional view of an example of an inverter according to a third embodiment of the present invention.

Next, an inverter according to the present invention is described. FIG. 9 is a schematic illustration showing a longitudinal sectional view of an example of an inverter according to a third embodiment of the present invention. The inverter 18 of the third embodiment uses the busbar 12 of the first embodiment.

As illustrated in FIG. 9, the inverter 18 of the third embodiment includes: a plurality of power modules 15; a busbar 12 for electrically connecting the power modules 15 with one another; a control board 14 for mounting a drive circuit to control the power modules 15; and a casing 11 for accommodating the power modules 15, busbar 12 and control board 14. Each power module 15 has various power semiconductor devices and is placed on a corresponding module heat dissipation plate 16 contained in the casing 11. The electrode of each power module 15 connected with the positive terminal of a DC power source is secured to the first conductor layer 1a (the positive side) of the pair of the first conductor layers 1 of the busbar 12 by means of a clamp screw 17. The electrode of each power module 15 connected with the negative terminal of the DC power source is secured to the first conductor layer 1b (the negative side) of the pair of the first conductor layers 1 of the busbar 12 by another clamp screw 17. The control board 14 controls the switching operations of the power semiconductor devices mounted in the power modules 15.

The inverter 18 of the third embodiment uses the invented high current carrying busbar 12 having the structure that prevents partial discharge occurrence and reduces the degradation of the insulating layer 2; therefore the inverter 18 has long term reliability. That is, the inverter 18 has a long service life. Although the inverter 18 of the third embodiment is described as using the busbar 12 of the first embodiment, the busbar 13 of the second embodiment may be used with the same advantageous effect.

As has been described above, the invented busbar prevents partial discharge occurrence between the current carrying conductor layers and the insulating layer, thereby reducing the degradation of the insulating layer. Thus, the present invention provides a power distribution mounting component (busbar) having a high partial discharge initiation voltage and high insulation reliability. The invention also provides a long service life inverter using the invented busbar. In addition, the invention provides a good recyclable busbar and an inverter using the busbar in which the thick conductor layers can be easily removed from the insulating layer.

LEGEND

1 First Conductor Layer,
2 Insulating Layer,
3 Adhesive Layer,
4 Second Conductor Layer,
5 Space (Gap),
6 Surface Microroughness,
7 Adhesive-on-Insulator Multilayer,
11 Casing,
12 Busbar,
13 Busbar,
14 Control Board,
15 Power Module,
16 Module Heat Dissipation Plate,
18 Inverter,
100 Thick Conductor,
102 Insulating Layer,
103 Adhesive Layer,
104 Adhesive-on-Insulator Multilayer,
105 Space (Gap),
106 Surface Microroughness,
112 Busbar, and
113 Busbar.

The invention claimed is:

1. A power distribution mounting component operable at high voltages, comprising:
   a thin insulating layer consisting of a substance for low inductance;
   current-carrying first conductor layers sandwiching the thin insulating layer; and
   a second conductor layer interposed between the thin insulating layer and at least one of the first conductor layers,
   wherein the thin insulating layer covers all of the first conductor layers; and
   the second conductor layer is thinner than the first conductor layers, covers all of the thin insulating layer, and is laminated to adhere closely to the thin insulating layer with no or little gaps therebetween.

2. The power distribution mounting component according to claim 1, wherein a thickness of the second conductor layer is 1 µm or more and less than 500 µm.

3. The power distribution mounting component according to claim 2, wherein a thickness of each of the first conductor layers is from 0.5 to 10 mm.

4. The power distribution mounting component according to claim 1, wherein a thickness of each of the first conductor layers is from 0.5 to 10 mm.

5. A power distribution mounting component operable at high voltages, comprising:
   an adhesive-on-insulator multilayer including:
      a thin insulating layer consisting of a substance for low inductance; and
      a thin adhesive layer consisting of a substance for low inductance on at least one surface of the thin insulating layer;
   current-carrying first conductor layers sandwiching the adhesive-on-insulator multilayer; and
   a second conductor layer interposed between the adhesive-on-insulator multilayer and at least one of the first conductor layers,
   wherein the thin insulating layer covers all of the first conductor layers; and
   the second conductor layer is thinner than the first conductor layers, covers all of the thin insulation layer, and is laminated to adhere closely to the thin insulating layer with no or little gaps therebetween.

6. The power distribution mounting component according to claim 5, wherein a thickness of the second conductor layer is 1 µm or more and less than 500 µm.

7. The power distribution mounting component according to claim 6, wherein a thickness of each of the first conductor layers is from 0.5 to 10 mm.

8. The power distribution mounting component according to claim 5, wherein a thickness of each of the first conductor layers is from 0.5 to 10 mm.

9. An inverter comprising:
   at least one power module having a plurality of power semiconductor devices;
   a control board including a drive circuit to drive switching operations of the power semiconductor devices; and
   a power distribution mounting component connected to the power module, the power distribution mounting component including:
      a thin insulating layer consisting of a substance for low inductance;
      current-carrying first conductor layers sandwiching the thin insulating layer; and
      a second conductor layer interposed between the thin insulating layer and at least one of the first conductor layers, wherein the thin insulating layer covers all of the first conductor layers; and the second conductor layer is thinner than the first conductor layers, covers all of the thin insulating layer, and is laminated to adhere closely to the thin insulating layer with no or little gaps therebetween.

10. The inverter according to claim 9, wherein a thickness of the second conductor layer is 1 μm or more and less than 500 μm.

11. The inverter according to claim 10, wherein a thickness of each of the first conductor layers is from 0.5 to 10 mm.

12. The inverter according to claim 8, wherein a thickness of each of the first conductor layers is from 0.5 to 10 mm.

13. An inverter comprising:
   at least one power module having a plurality of power semiconductor devices;
   a control board including a drive circuit to drive switching operations of the power semiconductor devices; and
   a power distribution mounting component connected to the power module, the power distribution mounting component including:
   an adhesive-on-insulator multilayer including:
      a thin insulating layer consisting of a substance for low inductance; and
      a thin adhesive layer consisting of a substance for low inductance on at least one surface of the thin insulating layer;
   current-carrying first conductor layers sandwiching the adhesive-on-insulator multilayer; and
   a second conductor layer interposed between the adhesive-on-insulator multilayer and at least one of the first conductor layers,
   wherein the thin insulating layer covers all of the first conductor layers; and
   the second conductor layer is thinner than the first conductor layers, covers all of the thin insulating layer, and is laminated to adhere closely to the thin insulating layer with no or little gaps therebetween.

14. The inverter according to claim 13, wherein a thickness of the second conductor layer is 1 μm or more and less than 500 μm.

15. The inverter according to claim 14, wherein a thickness of each of the first conductor layers is from 0.5 to 10 mm.

16. The inverter according to claim 13, wherein a thickness of each of the first conductor layers is from 0.5 to 10 mm.

* * * * *